United States Patent
Knöll et al.

(10) Patent No.: US 7,235,346 B2
(45) Date of Patent: *Jun. 26, 2007

(54) PHOTOSENSITIVE, FLEXO PRINTING ELEMENT AND METHOD FOR THE PRODUCTION OF NEWSPAPER FLEXO PRINTING PLATES

(75) Inventors: Rolf Knöll, Weinheim (DE); Hartmut Sandig, Frankenthal (DE); Uwe Stebani, Flörsheim-Dalsheim (DE); Thomas Telser, Weinheim (DE); Thomas Zwez, Karlsruhe (DE)

(73) Assignee: XSYS Print Solutions Deutschland GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/485,201

(22) PCT Filed: Jul. 18, 2002

(86) PCT No.: PCT/EP02/07997

§ 371 (c)(1),
(2), (4) Date: Jan. 29, 2004

(87) PCT Pub. No.: WO03/014831

PCT Pub. Date: Feb. 20, 2003

(65) Prior Publication Data

US 2004/0187719 A1    Sep. 30, 2004

(30) Foreign Application Priority Data

Aug. 3, 2001   (DE) ............................. 101 37 629

(51) Int. Cl.
G03F 7/028 (2006.01)
G03F 7/032 (2006.01)
G03F 7/11 (2006.01)

(52) U.S. Cl. .................. 430/286.1; 430/271.1; 430/273.1; 430/306; 430/309; 430/434; 430/494; 430/944; 430/945

(58) Field of Classification Search ............ 430/270.1, 430/271.1, 273.1, 281.1, 286.1, 306, 309, 430/434, 494, 944, 945

See application file for complete search history.

(56) References Cited

U.S. PATENT DOCUMENTS

| | | | |
|---|---|---|---|
| 3,760,824 A | 9/1973 | Edwards et al. | |
| 4,045,231 A | 8/1977 | Toda et al. | |
| 4,076,033 A | 2/1978 | Busse et al. | |
| 4,323,636 A | 4/1982 | Chen et al. | |
| 4,423,135 A * | 12/1983 | Chen et al. ............ | 430/271.1 |
| 4,430,417 A | 2/1984 | Heinz et al. | |
| 4,788,992 A | 12/1988 | Swainbank et al. | |
| 4,940,650 A * | 7/1990 | Kurtz et al. ............ | 430/283.1 |
| 5,262,275 A | 11/1993 | Fan et al. | |
| 5,460,920 A | 10/1995 | Telser et al. | |
| 5,506,086 A | 4/1996 | Van Zoeren et al. | |
| 5,512,420 A | 4/1996 | Hallman et al. | |
| 5,607,814 A | 3/1997 | Fan et al. | |
| 5,719,009 A | 2/1998 | Fan | |
| 6,037,102 A | 3/2000 | Loerzer et al. | |
| 6,326,127 B1 | 12/2001 | Morren et al. | |
| 6,358,668 B1 | 3/2002 | Leenders et al. | |
| 6,531,263 B2 * | 3/2003 | Knoll ................. | 430/287.1 |
| 6,737,216 B2 * | 5/2004 | Kannurpatti et al. ..... | 430/270.1 |
| 6,794,115 B2 * | 9/2004 | Telser et al. ........... | 430/273.1 |
| 2002/0001775 A1 | 1/2002 | Knoll et al. | |
| 2003/0178130 A1 | 9/2003 | Knoell et al. | |
| 2004/0231540 A1 * | 11/2004 | Hiller ................. | 101/401.1 |

FOREIGN PATENT DOCUMENTS

| | | |
|---|---|---|
| EP | 0 371 123 | 6/1990 |
| EP | 0 422 488 A2 | 4/1991 |
| EP | 0 767 407 A1 | 4/1997 |
| EP | 1 072 953 | 1/2001 |
| EP | 1 158 364 | 11/2001 |
| EP | 1 158 364 A2 | 11/2001 |
| JP | A-58 052 646 | 3/1983 |
| WO | WO 96/16356 | 5/1996 |
| WO | WO 00/41036 | 7/2000 |
| WO | WO 02/17020 | 2/2002 |

OTHER PUBLICATIONS

Technik des Flexodrucks, p. 141/142, vol. 4, 1999, Coating Verlag, St. Gallen, Schweiz.

* cited by examiner

*Primary Examiner*—Barbara L. Gilliam
(74) *Attorney, Agent, or Firm*—Novak Druce & Quigg, LLP

(57) ABSTRACT

The present invention relates to a photosensitive flexographic printing element for the production of flexographic newspaper printing plates, comprising at least a flexible, metallic support, an adhesive layer applied thereto, a photopolymerizable layer which can be developed in organic media and which itself comprises at least one elastomeric binder, ethylenically unsaturated monomers, a photoinitiator or photoinitiator system and a plasticizer, a transparent substrate layer, and optionally a removable protective film, where the total thickness of the flexographic printing element is from 300 to 1000 μm, the elastomeric binder has a weight average molecular weight $M_w$ of from 80,000 to 150,000 g/mol and a Shore A hardness of from 50 to 80, and the amount of plasticizer is from 5 to 50% by weight, based on the amount of all constituents of the photopolymerizable layer, and to a process for the production of flexographic newspaper printing plates by imagewise exposure of the flexographic printing element to actinic light, followed by development and drying at from 105 to 160° C.

15 Claims, No Drawings

PHOTOSENSITIVE, FLEXO PRINTING ELEMENT AND METHOD FOR THE PRODUCTION OF NEWSPAPER FLEXO PRINTING PLATES

The present invention relates to a photosensitive flexographic printing element for the production of flexographic newspaper printing plates, comprising at least a flexible, metallic support, an adhesive layer applied thereto, a photopolymerizable layer which can be developed in organic media and which itself comprises at least one elastomeric binder, ethylenically unsaturated monomers, a photoinitiator or photoinitiator system and a plasticizer, a transparent substrate layer, and optionally a removable protective film, where the total thickness of the flexographic printing element is from 300 to 1000 μm, the elastomeric binder has a weight average molecular weight $M_w$ of from 80,000 to 150,000 g/mol and a Shore A hardness of from 50 to 80, and the amount of plasticizer is from 5 to 50% by weight, based on the amount of all constituents of the photopolymerizable layer.

In a second aspect, the present invention relates to a process for the production of flexographic newspaper printing plates, in which the starting material employed is the flexographic printing element outlined at the outset, which is exposed imagewise to actinic light, the exposed layer is developed using an organic solvent or an organic solvent mixture and at the same time the substrate layer is removed, and the element is dried at from 105 to 160° C.

The invention furthermore relates to a flexographic printing plate which is obtainable by the process outlined.

Newspapers are nowadays in most cases produced by offset printing. Increasingly, however, flexographic printing is being employed for the printing of newspapers since flexographic printing has a number of technical advantages. In the flexographic printing process, the printing can be started up much more quickly than in the offset process. In addition to the time saving, this also means a considerable saving of paper. Furthermore, offset printing can be carried out using paste-form inks containing mineral oil. In coldset offset printing, the oils for the most part remain in the paper, which causes considerable amounts of black rub-off. In heatset offset printing, the mineral oils are liberated during drying of the printing ink. In flexographic printing with water-based printing inks, which are absorbed quickly by the paper, the black rub-off is significantly reduced, and no solvents are emitted. The printing machines can be cleaned simply using water.

However, the disadvantage of flexographic printing compared with offset printing is that the processing time of the photosensitive flexographic printing element to give the finished flexographic printing cliché is considerably longer than the processing time in the case of offset printing plates. Typical processing times for flexographic printing plates are in the order of 6 hours or more. However, for the printing of newspapers using flexographic printing plates, processing times of more than 30 minutes are unacceptable. There is therefore a demand for suitable processes for shortening the processing time.

It is known from the prior art that flexographic printing plates for newspaper printing can be produced starting from flexographic printing elements which can be developed in aqueous media. EP-A 371 123 discloses a process and an apparatus for the production of flexographic printing plates for newspaper printing in which the washing-out is carried out with water at a pressure of from 35 to 70 bar, which is sprayed onto the flexographic printing element by means of a nozzle. Although the washing-out speed can be increased by raising the pressure, this may result in damage to fine relief elements. Flexographic printing plates which can be developed in aqueous media furthermore have the disadvantage that they frequently have inadequate swelling stability to printing inks. This applies both to water-based flexographic printing inks and to those containing organic solvents, such as alcohols or esters.

Furthermore, the resolution of plates which can be developed in aqueous media is inadequate for some applications. It is known that resolutions of 60 l/cm can be achieved using flexographic printing plates which can be developed in organic media. It would therefore be desirable also to be able to employ plates based on organic binders for newspaper printing.

However, the person skilled in the art encounters further problems in flexographic newspaper printing. Newsprint is a comparatively rough print medium. Suitable flexographic printing plates for printing on rough print media are those which are particularly soft, for example those having a Shore A hardness of from 30 to 40, which are better able to adapt to an uneven or rough surface of the print medium. This is described, for example, in "Technik des Flexodrucks", pp. 141/142, 4th Edn., 1999, Coating Verlag, St. Gallen, Switzerland. However, the softer a printing relief, the more so-called "squashed edges" occur at the edges of the individual relief elements during printing, resulting in an unclean print and limiting the resolution. This applies in particular to very small relief elements, for example fine screen tone values, narrow lines or small characters, since these can only exert very low resistance against the pressure of the printing cylinder owing to their small area. However, it is precisely relief elements of this type that are important in newspaper printing.

It is an object of the present invention to provide a faster process for the production of flexographic printing plates for newspaper printing by means of which the processing times can be significantly shortened. A further object of the present invention was to provide photosensitive flexographic printing elements which firstly enable fast processing to give flexographic printing plates and secondly facilitate printing in high resolution on rough newsprint.

We have found that this object is achieved by a photosensitive flexographic printing element for the production of flexographic printing plates for newspaper printing which comprises at least a flexible, metallic support, an adhesive layer applied thereto, a photopolymerizable layer which can be developed in organic media and which itself comprises at least one elastomeric binder, ethylenically unsaturated monomers, a photoinitiator or photoinitiator system and a plasticizer, a transparent substrate layer, and optionally a removable protective film, where the total thickness of the flexographic printing element is from 400 to 1000 μm, the elastomeric binder has a weight average molecular weight $M_w$ of from 80,000 to 150,000 g/mol and a Shore A hardness of from 50 to 80, and the amount of plasticizer is from 5 to 50% by weight, based on the amount of all constituents of the photopolymerizable layer.

We have furthermore found a process for the production of flexographic newspaper printing plates in which the starting material employed is the flexographic printing element outlined at the outset, which is exposed imagewise to actinic light, the exposed layer is developed using an organic solvent or an organic solvent mixture and at the same time the substrate layer is removed, and the element is dried at from 105 to 160° C.

In a third aspect of the invention, we have found a flexographic printing plate which is obtainable by the outlined process.

It was surprising and also unexpected to the person skilled in the art that the object of the invention is not achieved by a flexographic printing having a soft relief layer, but, in contrast, by a flexographic printing plate having a relatively hard relief layer. The combination according to the invention of a relatively hard elastomeric binder with large amounts of plasticizer has, surprisingly, achieved a significant shortening of the processing times. The flexographic printing element according to the invention can be processed to give a ready-to-print flexographic printing plate within less than 30 minutes by means of the process according to the invention.

The following details apply to the invention.

The photosensitive flexographic printing element according to the invention has a flexible metallic support. For the purposes of the present invention, the term "flexible" is taken to mean that the supports are sufficiently thin that they can be bent around the printing cylinder. On the other hand, however, they are also dimensionally stable and sufficiently thick that the support is not kinked during production of the flexographic printing element or during mounting of the finished printing plate on the printing cylinder.

Suitable flexible metallic supports are in particular thin metal sheets or foils made from steel, preferably stainless steel, magnetizable spring steel, aluminum, zinc, magnesium, nickel, chromium or copper, it also being possible for the metals to be alloyed. It is also possible to employ combined metallic supports, for example steel sheets coated with tin, zinc, chromium, aluminum, nickel or also combinations of various metal-coated steel sheets, or also metal supports obtained by lamination of identical or different metal sheets. It is furthermore also possible to employ pretreated sheets, for example phosphated or chromatized steel sheets or anodized aluminum sheets. In general, the sheets or foils are degreased before use. Preference is given to supports made from steel or aluminum. Particular preference is given to magnetizable spring steel.

The thickness of flexible metal supports of this type is usually from 0.025 mm to 0.4 mm and depends, besides on the desired degree of flexibility, also on the type of metal employed. Supports made from steel usually have a thickness of from 0.025 to 0.25 mm, in particular from 0.14 to 0.24 mm. Supports made from aluminum usually have a thickness of from 0.25 to 0.4 mm.

The flexible metallic support has an adhesive layer located thereon. The adhesive layer promotes good adhesion between the flexible, metallic support and the photopolymerizable layer to be applied later, and consequently the printing elements obtained by imagewise exposure of the photopolymerizable layer are not torn, detached or kinked either during development of the plate or during printing. In principle, any desired adhesive layers can be employed, provided that they promote adequate adhesion.

In a preferred embodiment, the adhesive layer preferably comprises a UV absorber. The UV absorber prevents UV light from being scattered back into the relief layer by the metallic support. Reflections of this type may under certain circumstances reduce the exposure latitude and impair the possible resolution. Adhesive layers which are particularly suitable for carrying out the invention are disclosed, for example, in the application DE-A 100 40 929.

The flexographic printing element according to the invention furthermore has a photopolymerizable layer which can be developed in organic media and which itself comprises at least one elastomeric binder, ethylenically unsaturated monomers, a photoinitiator or photoinitiator system, at least one plasticizer and optionally further constituents.

In accordance with the invention, the elastomeric binder has a mean molecular weight $M_w$ (weight average) of from 80,000 to 150,000 g/mol. If the molecular weight is greater, the processing time is no longer adequate in all cases, although satisfactory results can also be achieved at higher molecular weights in special cases. If the molecular weight is lower, the hardness of the layer is no longer adequate in all cases, although satisfactory results can also be achieved at lower molecular weight in special cases. The molecular weight is preferably from 90,000 to 140,000 g/mol and particularly preferably from 100,000 to 130,000 g/mol.

Also central to the invention is the Shore A hardness of the elastomeric binder employed. This is determined in accordance with the procedure of ISO 868. In accordance with the invention, the elastomeric binder employed has a Shore A hardness of from 50 to 80. The Shore A hardness of the binder is particularly preferably from 55 to 75 and very particularly preferably from 60 to 75.

Suitable elastomeric binders can be elastomeric or thermoplastic-elastomeric binders. Examples are the known block copolymers of the SIS or SBS type, which can also be fully or partially hydrogenated. Further examples include elastomeric polymers of the ethylene-propylene-diene type or elastomeric polymers based on acrylates or acrylate copolymers. The person skilled in the art makes a suitable selection from the elastomers that are suitable in principle taking into account the parameters of hardness and molecular weight which are essential to the invention. In general, the elastomeric binder is itself soluble or at least swellable in organic solvents. The binder is preferably soluble. However, it is sufficient for the invention if the layer as a whole can be developed in organic media.

Suitable elastomeric binders are, in particular, thermoplastic-elastomeric block copolymers of the SIS or SBS type. These may be linear three-block copolymers, two-block copolymers, polymers having a plurality of elastomeric and thermoplastic blocks, radial or quasi-radial block copolymers, or mixtures thereof. Also suitable are block copolymers of the S—(SB)—S type, whose elastomeric blocks are composed randomly of butadiene and styrene. Polymers of this type are known under the name Styroflex®.

Preference is given to SBS block copolymers. The styrene content of suitable SBS block copolymers is usually from 20 to 50% by weight, preferably from 25 to 45% by weight and particularly preferably from 25 to 40% by weight. Suitable SBS polymers are obtainable, for example, under the name Kraton®.

The photopolymerizable layer may, as well as the binders mentioned, additionally contain at least one secondary binder in small amounts. These serve to fine-control the properties of the layer and need not necessarily meet the Shore A hardness and $M_w$ requirements described, as long as the newspaper printing properties of the printing plate are not adversely affected. In general, the amount of a secondary binder is in the range from 0 to 10% by weight based on all constituents of the layer.

The secondary binder is particularly preferably from 1 to 10% by weight, based on the amount of all constituents of the photopolymerizable layer, of an SIS block copolymer. Suitable SIS polymers can be obtained, for example, under the name Kraton®.

The amount of elastomeric binder or binder mixture in a relief layer is generally from 40 to 90% by weight, preferably from 40 to 85%, particularly preferably from 40 to 80% by weight, based on the amount of all constituents.

In accordance with the invention, the binder is employed in combination with a suitable plasticizer. It is also possible to employ mixtures of different plasticizers. Examples of suitable plasticizers are modified and unmodified natural oils and resins, alkyl, alkenyl, arylalkyl or arylalkenyl esters of acids, such as alkanoic acids, arylcarboxylic acids or phosphoric acid; synthetic oligomers or resins, such as oligostyrene, oligomeric styrene-butadiene copolymers, oligomeric α-methylstyrene-p-methylstyrene copolymers, liquid oligobutadienes, or liquid oligomeric acrylonitrile-butadiene copolymers; and polyterpenes, polyacrylates, polyesters or polyurethanes, polyethylene, ethylene-propylene-diene rubbers or α-methyl-oligo(ethylene oxide). Examples of particularly suitable plasticizers are paraffinic mineral oils; esters of dicarboxylic acids, such as dioctyl adipate or dioctylterephthalate; naphthenic plasticizers or polybutadienes having a molecular weight of from 500 to 5000 g/mol.

In accordance with the invention, the amount of plasticizer in the photopolymeric layer is from 5 to 50% by weight, based on the amount of all constituents. If the amount is less than 5% by weight, the plate generally cannot be processed sufficiently quickly, although satisfactory results may be achieved in special cases. In addition, these plates have strong anisotropy, with the negative printing properties this causes. If the amount of plasticizer is greater than 50% by weight, the relief properties are generally no longer suitable for flexographic printing. The precise amount is selected by the person skilled in the art depending on the binder used and the desired hardness of the printing plate. The amount employed is preferably from 10 to 40% by weight, particularly preferably from 20 to 35% by weight.

In a known manner, the photosensitive layer furthermore comprises polymerizable compounds, or monomers. The monomers should be compatible with the binders and should have at least one polymerizable, ethylenically unsaturated double bond. Suitable monomers generally have a boiling point of above 100° C. at atmospheric pressure and a molecular weight of up to 3000 g/mol, preferably up to 2000 g/mol. Esters or amides of acrylic acid or methacrylic acid with mono- or polyfunctional alcohols, amines, aminoalcohols or hydroxyethers and -esters, esters of fumaric or maleic acid or alkyl compounds have proven particularly advantageous. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate, N-dodecylmaleimide. The amount of monomers in the relief layer is generally from 4 to 30% by weight, preferably from 4 to 20% by weight, based on the amount of all constituents.

In a manner that is known in principle, the relief layer furthermore comprises a photoinitiator or a photoinitiator system. Examples of suitable initiators are benzoin or benzoin derivatives, such as α-methylbenzoin or benzoin ethers, benzil derivatives, such as benzil ketals, acylarylphosphine oxides, bisacylphosphine oxides, acylarylphosphenic esters, polycyclic quinones or benzophenones. The amount of photoinitiator in the relief layer is generally from 0.1 to 5% by weight, based on the amount of all constituents.

The relief layer may optionally comprise further constituents, such as inhibitors for thermally initiated polymerization, dyes, pigments, photochromic additives, regulator systems, antioxidants, further binders for fine control of the properties or extrusion aids. In general, however, not more than 10% by weight of additives of this type are employed.

Further useful constituents include in particular compounds which speed up photochemical crosslinking. Suitable for this purpose are for example tertiary amines which have hydrogen atoms disposed a relative to the nitrogen atom. As examples there may be mentioned alkyl dialkylaminobenzoates such as ethyl diethylaminobenzoate.

The photopolymerizable layer may also be a plurality of photopolymerizable layers of identical, approximately identical or different composition one on top of the other. A multilayered structure has the advantage that the properties of the surface of the printing plate, for example ink transfer, can be modified without affecting the flexotypical properties of the printing plate, for example hardness or elasticity. Surface properties and layer properties can thus be modified independently of one another in order to achieve an optimum print result.

The thickness of the photopolymerizable layer or of all photopolymerizable layers together is generally in the range from about 100 to about 950 μm and preferably in the range from 200 to 500 μm.

The photopolymerizable flexographic printing element according to the invention furthermore has a light-transparent, non-tacky top layer. Substrate layers in the form of a relief layer or top layer are also known and simplify the removal of any protective film present before use of the flexographic printing element and thus prevent damage to the relief layer. They furthermore simplify the positioning and removal of the photographic negatives for imaging.

Substrate layers are formed from a polymer which forms tear-resistant films and any additives present therein. Depending on the type of polymer used, the substrate layer may be soluble in organic solvents or in aqueous solvents. Examples of suitable polymers which form tear-resistant films are polyamides, fully or partially saponified polyvinyl acetates or polyethylene oxide-vinyl acetate graft polymers, copolyamides, polyurethanes, poly(meth)acrylates, polyvinyl alcohol-alkanecarboxylates having a degree of hydrolysis of from 30 to 99%, cyclized rubbers having a high degree of cyclization, ethylene-propylene copolymers, homopolymers and copolymers of vinyl chloride or ethylene-vinyl acetate copolymers. Examples of suitable substrate layers which contain additives are disclosed in DE-A 28 23 300 and DE-B 21 23 702. In general, the substrate layers have a thickness of from 0.2 to 25 μm, preferably from 2 to 20 μm.

The flexographic printing element according to the invention may optionally be protected against damage by a protective film, for example a protective film of PET, which is located on the respectively uppermost layer of the flexographic printing element, i.e. in general on the substrate layer. If the photosensitive flexographic printing element has a protective film, this must be removed before the process according to the invention is carried out.

The total thickness of the photosensitive printing element according to the invention comprising support, adhesive layer, photosensitive layer and substrate layer—without any protective film that may be present—is from 300 to 1000 μm, preferably from 400 to 1000 μm, particularly preferably from 400 to 800 μm and very particularly preferably from 450 to 750 μm.

The flexographic newspaper printing element according to the invention can be produced, for example, by dissolving the constituents of the adhesive layer, the photopolymerizable layer and the substrate layer in each case in a suitable solvent and applying them to the metallic support in layers one after the other. The protective film can optionally be applied at the end. Alternatively, the layers can be cast onto the protective film in the reverse sequence, and the metallic support finally laminated. A suitable process is furthermore disclosed in the application DE-A 100 40 929.

The flexographic printing element according to the invention is intended for conventional imaging by means of photographic masks. A second embodiment of the flexographic element according to the invention can be a flexographic printing element which can be imaged digitally. In the second embodiment, the flexographic printing element has an additional layer which can be imaged digitally. This may be located on the transparent substrate layer, but the substrate layer is preferably omitted if layers which can be imaged digitally are present.

The layer which can be imaged digitally is preferably a layer selected from the group consisting of IR-ablative layers, ink-jet layers and thermographic layers.

IR-ablative layers or masks are opaque at the wavelength of the actinic light and usually comprise a binder and at least one IR absorber, for example carbon black. Carbon black also ensures that the layer is opaque. A mask can be inscribed into the IR-ablative layer by means of an IR laser, i.e. the layer is decomposed and removed at the points at which it is hit by the laser beam. Imagewise irradiation with actinic light can be carried out through the resultant mask. Examples of the imaging of flexographic printing elements using IR-ablative masks are disclosed, for example, in EP-A 654 150 and EP-A 1 069 475.

In ink-jet layers, a layer which can be inscribed with ink-jet inks, for example a gelatine layer, is applied. This layer can be imaged by means of ink-jet printers. Examples are disclosed in EP-A 1 072 953.

Thermographic layers are layers which comprise substances which turn black under the influence of heat. Layers of this type comprise, for example, a binder and an organic silver salt and can be imaged by means of a printer having a thermal head. Examples are disclosed in EP-A 1 070 989.

The layers which can be imaged digitally can be cast onto the photopolymerizable layer or the substrate layer in a manner which is known in principle.

For the process according to the invention, the flexographic printing element according to the invention is employed as starting material. If the flexographic printing element has a protective film, this is firstly removed. The conventional procedure with a photographic negative is described first here.

In step (a), the flexographic printing element according to the invention is exposed imagewise to actinic light. Suitable actinic, i.e. chemically "active", light is, as is known, in particular UVA or UV/VIS radiation. The irradiation can on the one hand be carried out through a photographic mask placed on the flexographie printing element.

In a particularly advantageous embodiment of the process according to the invention, the flexographic printing element is pre-exposed to actinic light over the full area, i.e. without the photographic mask in position, in air in a step preceding the imagewise exposure (a). The amount of light here is limited so that the photopolymerizable layer is still soluble in the developer after the pre-exposure, i.e. the layer must not crosslink. Pre-exposure of this type has the effect that the content of the polymerization inhibitor oxygen in the photopolymer layer is reduced. The plate can then be exposed more quickly, and a better shoulder shape of the elements occurs. On use of commercially available exposure units having a power of, for example, 8 kW, a pre-exposure time of a few seconds is generally entirely sufficient.

After the imagewise exposure of the flexographic printing element, the flexographic printing element is developed in process step (b) using an organic solvent or organic solvent mixture. The unexposed areas of the relief layer, i.e. those covered by the mask, are removed in this step, while the exposed areas, i.e. the crosslinked areas, are retained.

In an embodiment of the invention, the substrate layer is likewise removed in this process step. For this purpose, use is made of a developer which is able to dissolve both the photopolymeric layer and the substrate layer. Suitable for this purpose are, in particular, the known wash-out agents for flexographic printing plates, which usually consist of mixtures of various organic solvents which interact in a suitable manner. For example, developers comprising naphthenic or aromatic petroleum fractions mixed with alcohols, for example benzyl alcohol or cyclohexanol, and, if desired, further components, for example alicyclic hydrocarbons, terpene hydrocarbons, substituted benzenes, for example diisopropylbenzene, or dipropylene glycol dimethyl ether, can be employed. Suitable wash-out agents are disclosed, for example, in EP-A 332 070 or EP-A 433 374.

The development step is usually carried out at temperatures above 30° C. In a preferred embodiment of the invention, the development step is carried out at higher temperatures owing to the faster wash-out speeds that can be achieved. For safety reasons and in order to reduce the complexity of the development unit, the temperature should be from 5 to 15° C. below the flash point of the wash-out agent employed.

In an alternative embodiment, a substrate layer consisting of water-soluble polymers can advantageously be selected for the flexographic printing element. This substrate layer can preferably be removed using water or a predominantly aqueous solvent in a step preceding the actual development. The element is then briefly subjected to interim drying, for example by blowing with air or compressed air, and can then be developed in an organic solvent or organic solvent mixture.

The alternative embodiment preferably does not use mixtures of various organic solvents, but instead only a single organic solvent or a certain boiling fraction of a homologous series. For example, it is possible to employ hydrogenated petroleum fractions or alicyclic hydrocarbons, terpene hydrocarbons, substituted benzenes or dipropylene glycol dimethyl ether. Hydrogenated petroleum fractions having a boiling point of from 180 to 280° C. and a flash point of >55° C. have proven particularly successful for carrying out the development step. Dearomatized hydrocarbon fractions of this type are available, for example, under the name EXXSOL® D.

Although the two-step alternative procedure has one process step more, it has, however, the advantage that work-up of the developer is significantly simplified. The developers are usually redistilled on the spot. In the case of developers comprising various organic solvents, the distillate has a different composition to that actually desired, and has to be analyzed and corrected again by means of fresh solvent before re-use. This is unnecessary in the case of the use of a single solvent.

While standard flexographic printing plates having a PET support film can be dried at from 60 to 65° C., the flexographic printing plate developed in accordance with the invention can, owing to the metallic support, be dried at a temperature of from 105 to 160° C., preferably from 120 to 150° C. Since the drying is the rate-determining step of the process as a whole, this enables the overall process time for the flexographic printing plate to be drastically reduced. The dryer used should be an exhaust dryer in order to suppress the accumulation of solvent in the gas space. The solvent concentration in the gas space should be below the lower explosion limit. Neither requirement can be achieved by means of dryers designed for standard temperatures.

If desired, the dried flexographic printing element can then be subjected to conventional post-treatment steps, for example detackification by means of UV-C radiation.

The process according to the invention can be carried out in substantially standard apparatuses. Depending on the type of developer used, explosion protection may be necessary. Preference is given to an apparatus in which all process steps, namely removal of the substrate layer using water—interim drying—development—drying—post-treatment, can be carried out in-line.

It has been possible to achieve processing times of less than 30 minutes.

The process for the production of flexographic newspaper printing plates starting from flexographic printing elements having layers which can be imaged digitally is very similar to the conventional process.

Flexographic printing elements having ink-jet masks or thermographic masks can also be pre-exposed as described. Thus, a mask applied in advance can be evaporated, for example using a laser, or the layer can be rendered opaque to actinic light by treatment with a laser, as described, for example, in EP-A 654 150 and DE-A 33 42 579.

In the ink-jet process, an ink which is opaque to actinic light is applied to the non-image areas.

Depending on the solubility behavior of the binder employed as binder in the layer which can be imaged digitally, the layer which can be imaged digitally or the residues thereof can be removed and the relief layer developed in a single step. If binders which are soluble in aqueous media are employed, the layer which can be imaged digitally can also be removed using water, the element subjected to interim drying and the relief layer then developed using an organic solvent. In other words, the layer which can be imaged digitally replaces the substrate layer during processing.

The photosensitive flexographic printing elements of the present invention are also suitable for producing flexographic printing plates by direct laser engraving. It is preferably possible to use flexographic printing elements which contain styrene-butadiene block copolymers as a binder. Any protective film present is peeled off. Similarly, the transparent substrate layer can be peeled off. But it can also remain in place on the relief layer. It is further possible to produce dedicated laser-engravable flexographic printing elements from the start without transparent substrate layer.

In a first process step (A), the photopolymerizable layer is uniformly irradiated with actinic light and thereby crosslinked all over.

In a second process step (B), a suitable laser is used to engrave a printing relief into the crosslinked relief layer. If the transparent substrate layer has not already been peeled off, it can be peeled off prior to the laser engraving step. In laser engraving, the relief layer is removed or at least detached in those areas where it has been exposed to a laser beam of sufficient intensity. Preferably, the layer is without first melting vaporized or oxidatively decomposed, so that its decomposition products can be removed from the layer in the form of hot gasses, vapors, smoke or small particles.

Useful lasers for engraving include in particular $CO_2$ lasers having a wavelength of 10.6 μm. But it is also possible to use lasers having shorter wavelengths, provided the laser possesses sufficient intensity. For example, it is even possible to use a frequency-doubled (532 nm) or frequency-tripled (355 nm) Nd-YAG laser or else excimer laser (248 nm for example).

The image information to be engraved can be transferred to the laser apparatus directly from the layout computer system. The lasers can be operated either continuously or pulsed.

It is advantageous to engrave relief elements in which the side walls of the elements initially fall away perpendicularly and do not broaden until the lower region. This provides for a good shoulder shape of the relief points coupled with a minimal increase in tonal value. However, it is also possible to engrave side walls having a different shape.

The depth of the elements to be engraved depends on the total thickness of the relief and on the type of elements to be engraved and is determined by a person skilled in the art according to the properties desired for the printing plate. The depth of the relief elements to be engraved is at least 0.03 mm and preferably 0.05 mm; the reference here is to the minimum depth between individual dots. Printing plates having relief depths which are too small are generally unsuitable for printing by flexographic printing technology, since the negative elements fill up with printing ink to the point of flooding. Individual negative dots should customarily have greater depths; an advisable depth for negative dots 0.2 mm in diameter is customarily in the range from at least 0.07 to 0.08 mm. In the case of first surfaces which have been removed by engraving, a depth of more than 0.15 mm and preferably more than 0.4 mm is advisable. The latter is of course possible only in the case of an appropriately thick relief.

Advantageously, the flexographic printing plate obtained is aftercleaned in a further process step (C) after the laser engraving. In some cases, the cleaning can be effected by simply blowing off with compressed air or brushing off.

But it is preferable to use a liquid cleaning agent for the aftercleaning in order that complete removal may be achieved even of polymer fragments. The aftercleaning can most advantageously be effected using water or an aqueous cleaning agent. Aqueous cleaning agents consist essentially of water and also optionally small amounts of alcohols and may contain assistants, for example surfactants, emulsifiers, dispersants or bases, to augment the cleaning process. It is also possible to use mixtures which are used customarily for developing conventional, water-developable flexographic printing plates. But is also possible to use typical organic washoff agents for flexographic printing plates.

The aftercleaning can be effected for example by simply immersing or spraying down the relief printing plate or else be additionally augmented by mechanical means, as for example by brushing or treatment with a plush pad. It is also possible to use conventional flexographic plate washers. The aftercleaning also serves to remove any remaining residues on the transparent substrate layer.

The flexographic printing plate on a metal support which is obtained by the process according to the invention has a relief layer which generally has a Shore A hardness of from 50 to 80. Pressure tests show that even small relief elements are reproduced with very good quality on newsprint.

The flexographic printing plates obtained also have the advantage of providing distinctly more copies than when printing with flexographic printing plates which can be washed off with water. The relief layers exhibit only minimal swelling when printing with printing inks based on water or water-alcohol, so that printing at constant quality without excessive tonal value increase is possible even in the case of long runs. Waterborne inks are very rapidly absorbed in newsprint. It is possible to use thinner paper, for example at 42 $g/m^2$, than when offset printing with offset printing inks (customarily at least 45 $g/m^2$).

The examples which follow illustrate the invention:

INVENTIVE EXAMPLE 1

Production of the Light-Sensitive Flexographic Printing Element

A flexible, metallic support composed of steel and having a thickness of 170 μm was used. The support was provided with two bonding layers as described in EP-A 53 260, the overcoat containing a UV absorber.

The transparent substrate layer was produced by dissolving Joncryl 586 (styrene-acrylate copolymer from Johnson Wax) in benzyl alcohol and applying the solution to a PET film. This was followed by the application of a mixture of Joncryl 586 and Macromelt® 6900 (polyamide from Henkel), dissolved in an alkaline solution of toluene and alcohols.

The photopolymerizable layer which can be developed in organic media was produced using the components recited in table 1. The components were dissolved in toluene by intensive mixing and the solution obtained was cast onto the substrate-coated PET protective film (thickness 125 μm) and the solvent was removed.

TABLE 1

Components for photopolymerizable layer

| Component | Type | Amount (% by wt.) |
|---|---|---|
| SBS block copolymer | Kraton D-1102, 29.5% by weight of styrene, 72° Shore A hardness, MW = 125,000 g/mol | 67 |
| Plasticizer | Polyol 130 (polybutadiene oil) | 20 |
| Monomer | 1,6-Hexanediol diacrylate | 10 |
| Photoinitiator | Benzil dimethyl ketal | 2 |
| Additives | | 1 |
| Sum total | | 100 |

The photopolymeric layer obtained was laminated in a further step with the PET film remote side onto that side of the support which was coated with the bonding layer. The PET film then functions as a protective film for the flexographic printing element.

The photosensitive flexographic printing element obtained has a thickness of 675 μm. This is accounted for by 125 μm for the protective film, 10 μm for the substrate layer, 350 μm for the photopolymerizable relief layer and 190 μm for the support metal with bonding coat.

INVENTIVE EXAMPLE 2

Inventive example 1 was repeated except that 5% by weight of a secondary binder were used. The materials used are recited in table 2.

TABLE 2

Components for photopolymerizable layer

| Component | Type | Amount (% by wt.) |
|---|---|---|
| SBS block copolymer | Kraton D-1102, 29.5% by weight of polystyrene, 72° Shore A hardness, MW = 125,000 g/mol | 62 |

TABLE 2-continued

Components for photopolymerizable layer

| Component | Type | Amount (% by wt.) |
|---|---|---|
| SIS block copolymer | Kraton D-1161 NU, 15% by weight of polystyrene, 31° Shore A hardness, MW = 210,000 g/mol | 5 |
| Plasticizer | Polyöl 130 | 20 |
| Monomer | 1,6 Hexanediol diacrylate | 10 |
| Photoinitiator | Benzil dimethyl ketal | 2 |
| Additives | | 1 |
| Sum total | | 100 |
| | SBS/SIS ratio | 92.5/7.5 |

COMPARATIVE EXAMPLE 1

Inventive example 1 was repeated, except that the binder used (Kraton DX-1000) had a $M_w$ of 230,000 g/mol.

COMPARATIVE EXAMPLE 2

Inventive example 1 was repeated, except that the fraction of plasticizer was reduced to below 5 percent. The fractions of the other components increased accordingly.

COMPARATIVE EXAMPLE 3

Inventive example 1 was repeated, except that a styrene-butadiene-styrene block copolymer having a styrene content of 73% (Atofina, Finaclear 520, Shore A hardness>90°) was used. Just a cloudy photopolymerizable layer was obtained. The Shore A hardness of the layer was 98.

INVENTIVE EXAMPLE 3

Production of Flexographic Printing Plate

The PET protective film was peeled off the photosensitive flexographic printing element produced as per inventive example 1. The transparent substrate layer remained on the photosensitive layer. The plate was preexposed from the front with UV light for 3 s. A photographic negative was then placed on it and the photosensitive layer was subjected to imagewise exposure through the negative with UV-VIS light for 2.5 min.

The substrate layer and the unexposed parts of the relief layer were washed off with a washoff composition from Exxsol D60 (40%), decalin (40%) and pentanol (20%) at 30° C. within 4.5 min. The printing plate obtained was then dried at 130° C. The plate was completely dry after 5 min.

The printing plate was fully crosslinked and detackified by subsequent UVA and UVC postexposures of 5 minutes each.

The total time to produce the plate was 23 min.

The flexographic printing plate obtained was used to carry out the printing trials (W+H Olympia) on rough newsprint. The print was very good with regard to contrast, ink transfer and tonal value increase.

COMPARATIVE EXAMPLE 4

A commercial photosensitive flexographic printing element on PET film having a Shore A hardness of 33° (nyloflex FAC-X from BASF Drucksysteme GmbH) that is recommended for use with rough printing stocks was used and processed as per the recommended standard procedure (BASF Drucksysteme GmbH flexographic printing plates operating instructions) to give a flexographic printing plate. Drying was carried out at 65° C. The drying time was 2 h. The total time to produce the plate was more than 3 hours.

Printing trials were then carried out with the resulting flexographic printing plate as described in inventive example 3. The printed image exhibited severely squashed edges and flooded types at printing.

COMPARATIVE EXAMPLE 5

Inventive example 3 was repeated, except that the plate obtained was dried at 65° C. The total time to produce the plate was more than 2 h.

COMPARATIVE EXAMPLE 6

Inventive example 3 was repeated, except that the flexographic printing element described in comparative example 1 was used to produce the printing plate.

Both the washoff time and the drying time increased. The total time to produce the plate was more than 30 min.

COMPARATIVE EXAMPLE 7

Inventive example 3 was repeated, except that the flexographic printing element described in comparative example 2 was used to produce the printing plate. A (Owing to the insufficient in between depths on the plate, an unclean image was obtained in a printing test.

COMPARATIVE EXAMPLE 8

Inventive example 3 was repeated, except that the flexographic printing element described in comparative example 3 was used to produce the printing plate.

The cloudy photopolymerizable layer became fully crosslinked at imagewise exposure owing to excessive scattering and was no longer suitable for printing.

We claim:

1. A photosensitive flexographic printing element for the production of flexographic newspaper printing plates, comprising—applied one on top of the other—at least
    a flexible, metallic support,
    an adhesive layer applied thereto,
    a photopolymerizable layer which can be developed in organic media and which itself comprises at least one elastomeric binder, ethylenically unsaturated monomers, a photoinitiator or photoinitiator system and a plasticizer,
    a layer which can be imaged digitally, and
    optionally a removable protective film,
    wherein
    the total thickness of the flexographic printing element is from 300 to 1000 µm, the elastomeric binder is an SBS block copolymer which has a styrene content of from 20 to 50% by weight, which is optionally partially or fully hydrogenated, and which has a weight average molecular weight $M_w$ of from 80,000 to 150,000 g/mol and a Shore A hardness of from 50 to 80, and
    the amount of plasticizer is from 10 to 40% by weight, based on the amount of all constituents of the photopolymerizable layer.

2. A flexographic printing element as claimed in claim 1, wherein the photopolymerizable layer additionally comprises 0–10% by weight of at least one secondary binder.

3. A process for the production of flexographic printing plates for newspaper printing, where the starting material employed is a photosensitive flexographic printing element as claimed in claim 1, and the process comprises at least the following steps:
    (a) digitally imaging of the layer which can be imaged digitally,
    (b) exposure of the flexographic printing element to actinic light,
    (c) removal of the the digitally imaged layer and development of the exposed layer using an organic solvent or an organic solvent mixture,
    (d) drying of the layer,
    wherein the drying step (d) is carried out at a temperature of from 105 to 160° C.

4. A process as claimed in claim 3, wherein the drying step (d) is carried out at from 120 to 150° C.

5. A process as claimed in claim 3, wherein the development step (c) is carried out at a temperature of from 5 to 15° C. below the flash point of the solvent or solvent mixture.

6. A process as claimed in claim 3, wherein the flexographic printing element is exposed to actinic light over the entire area in air before the exposure (b), with the proviso that the amount of light is limited in such a way that the photopolymerizable layer is still soluble in the developer even after the pre-exposure.

7. A process as claimed in claim 3, wherein the digitally imaged layer is firstly removed using water or a substantially aqueous solvent mixture, the element is subjected to interim drying, and the exposed layer is then developed using an organic solvent or an organic solvent mixture.

8. A process as claimed in claim 7, wherein the development step is carried out using a hydrogenated petroleum fraction having a boiling range of from 180 to 280° C. and a flash point of >55° C.

9. A flexographic printing plate for newspaper printing, obtainable by a process as claimed in claim 3.

10. A flexographic printing plate as claimed in claim 9, wherein the relief layer has a Shore A hardness of from 50 to 80.

11. A process as claimed in claim 3, wherein the layer which can be imaged digitally is an IR-ablative layer, and the imaging is carried out by means of an IR laser.

12. A process as claimed in claim 3, wherein the layer which can be imaged digitally is a layer which can be inscribed with ink-jet inks, and the imaging is carried out by means of an ink-jet printer.

13. A process as claimed in claim 3, wherein the layer which can be imaged digitally is a thermographic layer comprising substances which turn black under the influence of heat, and the imaging is carried out by means of a printer having a thermal head.

14. A photosensitive flexographic printing element for the production of flexographic newspaper printing plates, comprising—applied one on top of the other—at least
    a flexible, metallic support,
    an adhesive layer applied thereto,
    a photopolymerizable layer which can be developed in organic media and which itself comprises at least one elastomeric binder, ethylenically unsaturated monomers, a photoinitiator or photoinitiator system and a plasticizer,
    a layer which can be imaged digitally, and
    optionally a removable protective film, wherein the total thickness of the flexographic printing element is from 300 to 1000 μm, the elastomeric binder has a weight average molecular weight $M_w$ of from 80,000 to 150,000 g/mol and a Shore A hardness of from 50 to 80, and the amount of plasticizer is from 10 to 40% by weight, based on the amount of all constituents of the photopolymerizable layer.

15. A photosensitive element as claimed in claim 14, wherein the layer which can be imaged digitally is a layer selected from the group consisting of IR-ablative layers, ink-jet layers and thermographic layers.

* * * * *